(12) United States Patent
Seguin et al.

(10) Patent No.: US 6,533,847 B2
(45) Date of Patent: Mar. 18, 2003

(54) ADSORPTION APPARATUS

(75) Inventors: Kevin J. Seguin, Champlin, MN (US); Paul Peterson, New Prague, MN (US); Kristine M. Graham, Minnetonka, MN (US)

(73) Assignee: Donaldson Company, Inc., Minneapolis, MN (US)

( * ) Notice: Subject to any disclaimer, the term of this patent is extended or adjusted under 35 U.S.C. 154(b) by 85 days.

(21) Appl. No.: 09/782,565

(22) Filed: Feb. 13, 2001

(65) Prior Publication Data

US 2002/0110510 A1 Aug. 15, 2002

(51) Int. Cl.[7] ............................................. B01D 53/04
(52) U.S. Cl. .......................... 96/129; 96/132; 96/136; 96/137; 96/138; 55/518
(58) Field of Search ..................... 96/121, 129, 131, 96/132, 136–139, 149, 151, 152; 55/495, 502, 504, 513, 518

(56) References Cited

U.S. PATENT DOCUMENTS

| | | | | |
|---|---|---|---|---|
| 3,354,623 A | * | 11/1967 | Keller ............................ | 55/484 |
| 4,292,059 A | * | 9/1981 | Kovach .......................... | 96/121 |
| 5,290,345 A | * | 3/1994 | Osendorf et al. ............... | 96/129 |
| 5,593,481 A | * | 1/1997 | Redner .......................... | 96/117.5 |
| 5,772,738 A | * | 6/1998 | Muraoka ........................ | 96/129 |
| 5,964,927 A | | 10/1999 | Graham et al. ................ | 96/121 |
| 6,113,674 A | | 9/2000 | Graham et al. ................ | 95/148 |
| 6,432,177 B1 | * | 8/2002 | Dallas et al. ................... | 96/132 |

OTHER PUBLICATIONS

U.S. patent application 09/660,127, filed Sep. 12, 2000.

* cited by examiner

Primary Examiner—David A. Simmons
Assistant Examiner—Frank M. Lawrence
(74) Attorney, Agent, or Firm—Merchant & Gould P.C.

(57) ABSTRACT

An adsorption bed arrangement includes a plurality of adsorption elements, a housing, and a gasket member. Each of the adsorption elements has a first adsorptive media and a second adsorptive media contained within a respective element. The first and second adsorptive medias remove different contaminants from the incoming air stream. For example, the first adsorptive media removes acidic contaminants and the second adsorptive media removes basic contaminants. Each of the adsorption elements is selectively openable to provide access to the adsorptive medias. The housing defines an interior, a plurality of inlet openings, and a plurality of outlet openings. The adsorption elements are positioned within the housing interior and the housing is selectively openable to provide access to the adsorption elements. The gasket member is between the housing and the adsorption elements. A method for changing filtering media in an adsorption apparatus includes steps of removing an access panel from an adsorption bed housing to expose a cover member covering an end of an adsorption element; removing the cover member from the end of the adsorption element to expose filtering media within the element; and pouring the filtering media from the element.

13 Claims, 11 Drawing Sheets

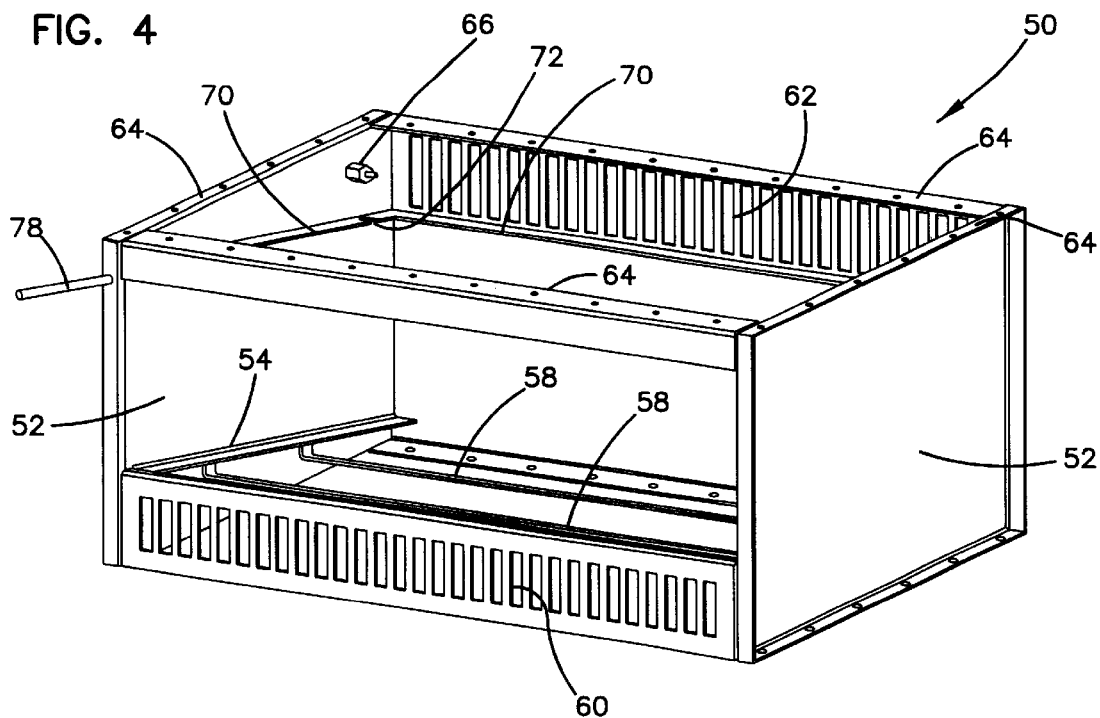
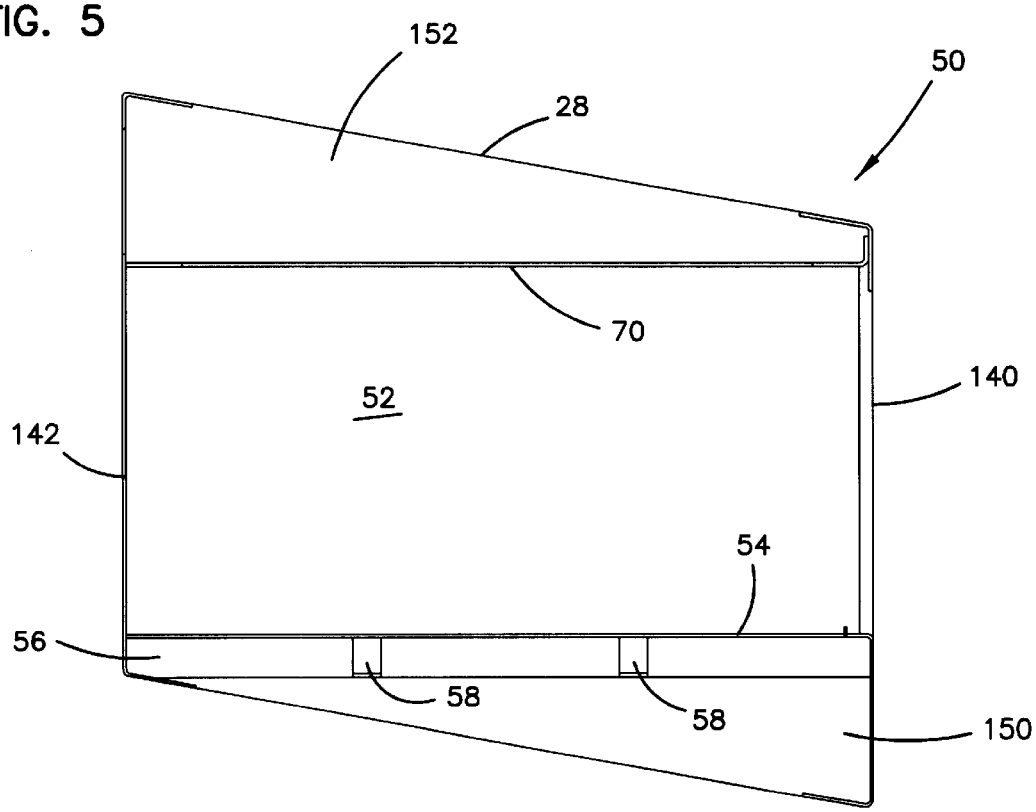

ADSORPTION APPARATUS

FIELD

The present invention relates to an adsorption bed and adsorption filtering system for removing airborne contaminants from enclosed interior rooms, particularly, rooms housing lithography processes.

BACKGROUND

Gas adsorption beds are used in many industries to remove airborne contaminants, such as organic bases, to protect people, the environment and often, a critical manufacturing process or the products that are manufactured. A specific example of an application for gas adsorption beds is the semiconductor industry where products are manufactured in an ultra-clean environment, commonly known in the industry as a "clean room". The manufacturing processes typically require the use of substances such as solvents to be used in the clean room environment. The use of these substances presents a problem because vapors that are present or are a byproduct from the process may contaminate the air and other processes in the room, such as lithography processes using chemically amplified photoresists, if not properly removed. In addition, environments may have gases that are naturally occurring in the ambient air, contaminants that cannot be removed by particulate filters. Typical previously recognized airborne contaminants include bases, such as ammonia, organic amines, and N-methyl-2-pyrrolidone.

To eliminate the airborne basic contaminants, contaminated air is often drawn through a granular adsorption bed assembly having a frame and an adsorption medium, such as activated carbon, retained within the frame. The adsorption medium adsorbs or chemically reacts with the gaseous contaminants from the airflow and allows clean air to be returned to the process and/or the clean room. The removal efficiency is critical in order to protect the processes and the products. The removal efficiency and capacity of the gaseous adsorption bed is dependent upon a number of factors, such as the air velocity through the adsorption bed, the depth of the bed, the type and amount of the adsorption medium being used and the activity level and rate of the adsorption medium. It is also important that for efficiency to be increased or maximized, the air leaking through voids between the tightly packed adsorption bed granules and the frame should be eliminated. Examples of granular adsorption beds include those taught is U.S. Pat. Nos. 5,290,245 (Osendorfet al.), 5,964,927 (Graham et al.) and 6,113,674 (Graham et al.).

Although the above identified adsorption beds, and other known beds, are used to remove bases, other airborne contaminants are also often present in the contaminated air. What is needed is an adsorption bed that can effectively remove both bases and other contaminants such as acids and other organic materials.

SUMMARY OF THE INVENTION

The invention is directed to an adsorption bed arrangement comprising a plurality of adsorption elements, a housing, and a gasket member between the housing and the adsorption elements. Each of the adsorption elements has a first adsorptive media and a second adsorptive media contained within a respective element. The first adsorptive media removes a first contaminant, such as acids, and the second adsorptive media removed a second contaminant, such as bases. Each of the adsorption elements is selectively openable to provide access to the adsorptive media. The elements are positioned within an interior of the housing, and the housing is selectively openable to provide access to the plurality of adsorption elements. In this manner, the adsorption elements can be accessed, opened, emptied of their existing media, and refilled with new, fresh adsorptive media.

Preferably, the housing has first and second opposite panels, and a side panel. The side panel is selectively removable to provide access to the adsorption elements. Preferably, the gasket member is situated in between to provide a seal between the side panel and the adsorption elements.

Preferably, each of the adsorption elements includes first and second opposite screens, an interior screen positioned between the first and second screens, and at least one open end. The first adsorptive media is removably packed between the first screen and the interior screen, and the second adsorptive media is removably paced between the interior screen and the second screen. In certain preferred arrangements, each adsorption element open end is covered with a removable cover member. Preferably, each of the cover members comprises a urethane pad.

In preferred arrangements, the adsorption bed assemblies are arranged in a vertical stack in an adsorption apparatus.

The invention is also directed to a method for changing filtering media in an adsorption apparatus. The method includes a step of removing an access panel from an adsorption bed housing to expose a cover member covering an end of an adsorption element. The cover member is removed from the end of the adsorption element to expose filtering media, such as first adsorptive media and second adsorptive media, within the element. The filtering media is then poured from the element. Preferably, after the step of pouring, new filtering media is added into the element. The cover member is then replaced over the end of the element, and the access panel is replaced on the adsorption bed housing.

In certain preferred methods, a first pre-filter is removed from the adsorption bed housing through a slot in the housing. After the step of removing a first pre-filter, a second, different and new pre-filter is inserted through the slot in housing.

These features and various other advantages that characterize the invention are pointed out with particularity in the claims annexed hereto and forming a part hereof However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

Referring now to the drawings, wherein like reference numerals and letters indicate corresponding structure throughout the several views:

FIG. 4 shows a perspective view of a frame section;

FIG. 5 shows a side sectional view of a frame section shown in FIG. 4;

DETAILED DESCRIPTION

Figure 1:
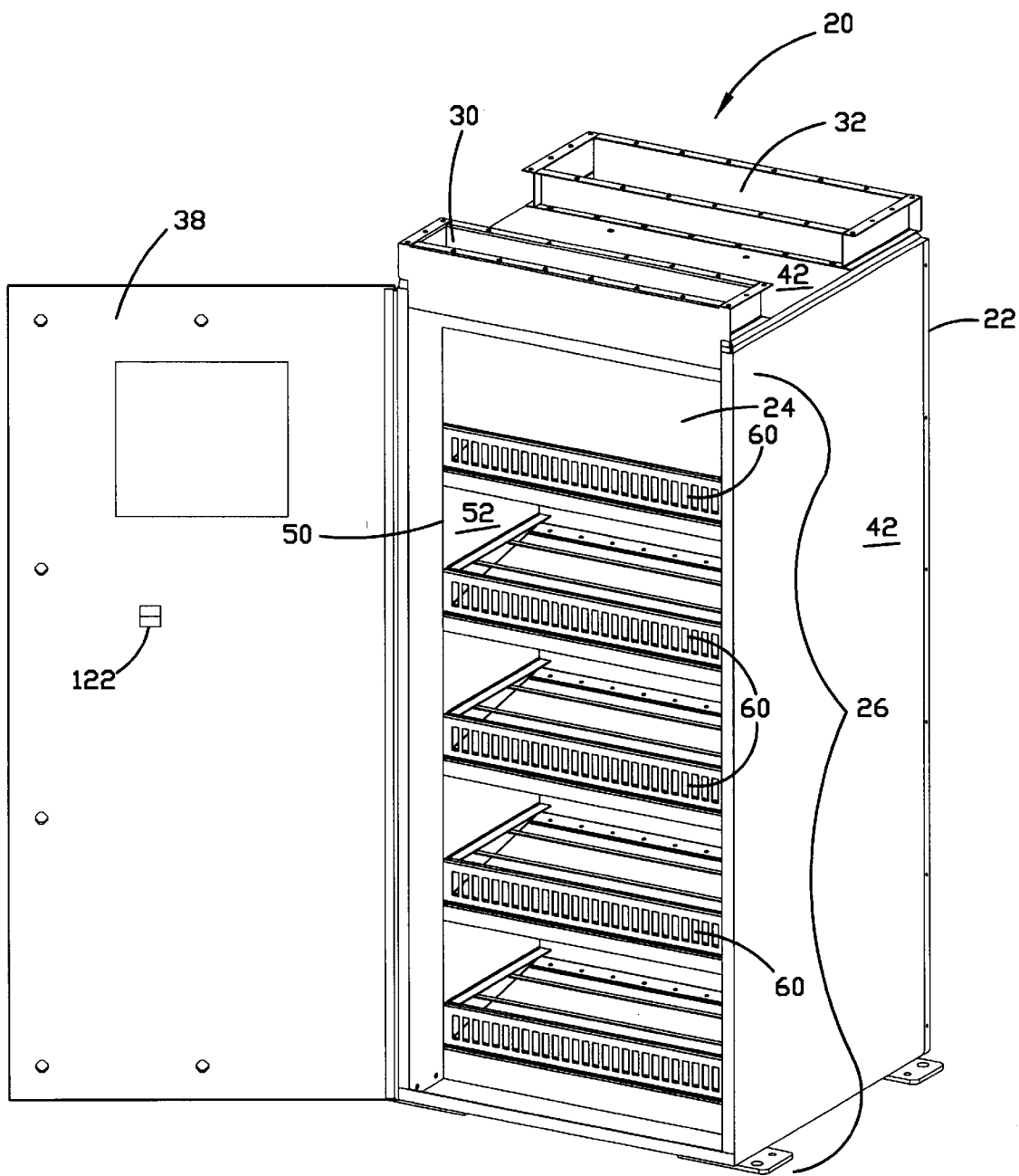
FIG. 1 shows a perspective view of an adsorption filtering system according to the principles of the invention.
Figure 2:
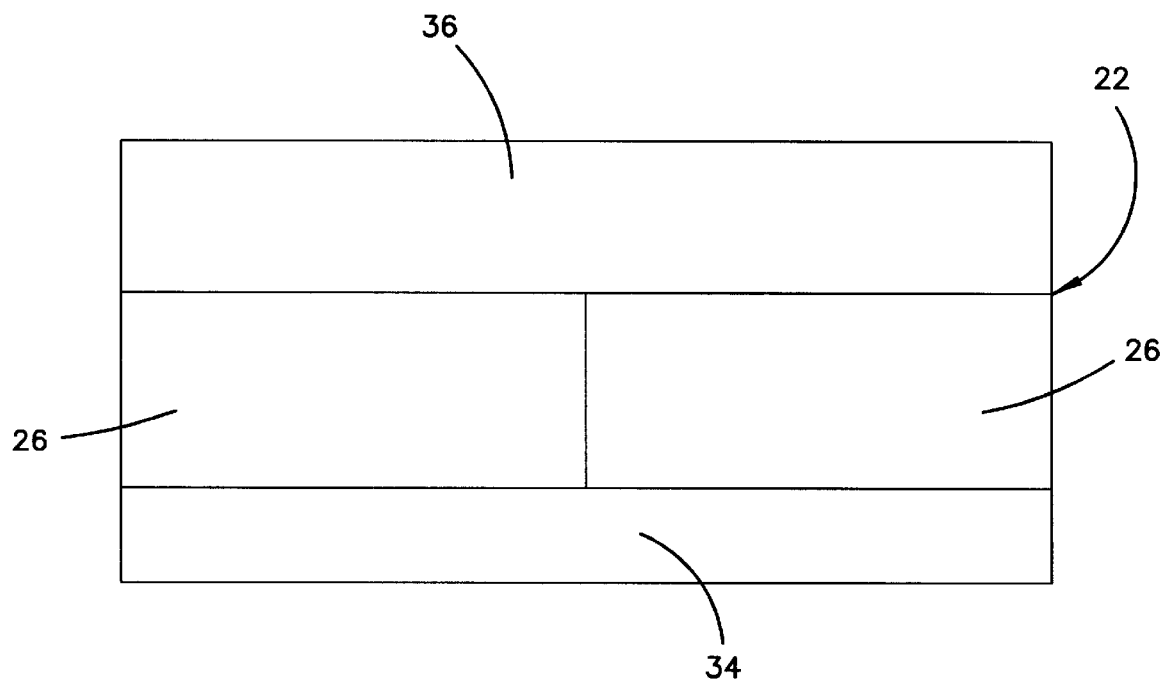
FIG. 2 shows a top plan view of an adsorptive system having two vertical stacks.

Referring now to the drawings, and in particular to FIG. 1, there is shown a counter flow adsorption module 22 of an adsorptive filtering system 20. Multiple modules 22 can be joined together to form a higher capacity adsorptive system 20, as shown in FIG. 2. The system 20 provides for a plurality of cartridge-type adsorption bed assemblies 24 receiving parallel flow with both vertical stacking shown most clearly in FIG. 1, as well as horizontal stacking, as shown in FIG. 2. With the present configuration, the height and width of the number of adsorption bed assemblies 24 can be designed to accommodate the filter and flow requirements of each particular system.

Referring again to FIG. 1, each module 22 includes an inlet 30 and an outlet 32 having flanges formed thereon for accepting a gasket and providing a sealed connection to upstream and downstream duct work. The counter flow adsorption module 22 includes an access door 38 pivoting along one vertical edge in a preferred configuration. A housing is formed of sealed housing panels 42, forming a sealed enclosure with air escaping only through inlet 30 and outlet 32. Access door 38 also includes gaskets for an enclosed airtight housing.

Figure 3:
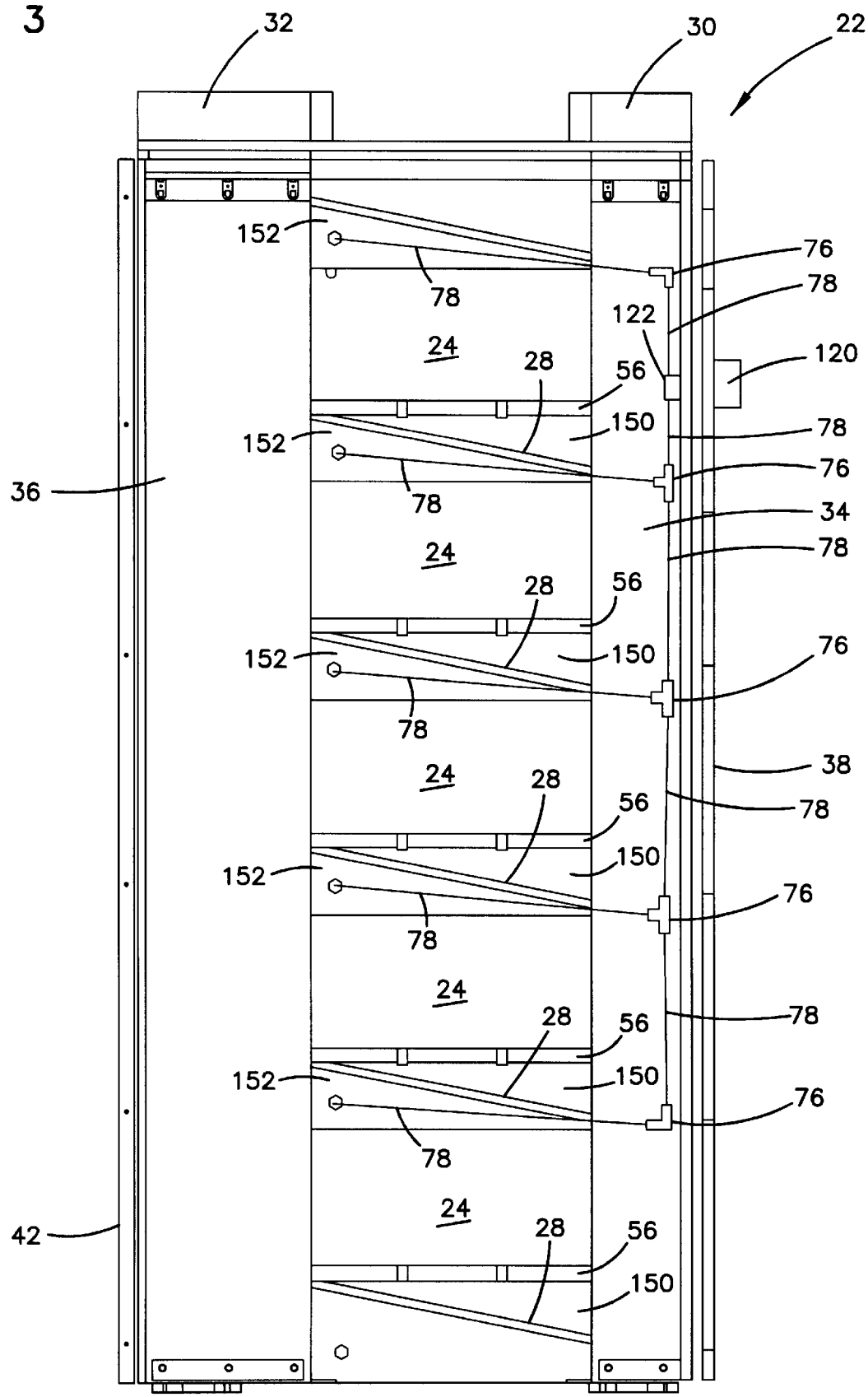
FIG. 3 shows a side sectional view of the adsorptive system shown in FIG. 1.

Referring now to FIG. 3, each counter flow adsorption module 22 supports a stack of adsorption bed assemblies 24. A corresponding number of adsorption bed assembly support frame sections 50 are stacked in a vertical configuration to form a frame 26 within the counter flow adsorption bed module 22. The adsorption bed assembly support frame 26 can be stacked in any height corresponding to the desired number of adsorption bed assemblies 24 that are to be used.

Extending vertically below inlet 30 is an inlet plenum 34. Extending vertically below outlet 32 is an outlet plenum 36. To provide for balanced distribution of flow between the multiple adsorption bed assemblies 24, the ratio of the cross sectional area of inlet plenum 34 to the cross-sectional area of outlet plenum 36 is 0.636. It has been found that such a ratio produces balanced flow between the various adsorption bed assemblies 24. In this manner, the activated carbon or other adsorption material in each adsorption bed assembly 24 deteriorates at the same rate. As inlet 30 and outlet 32 are both on the top, airflow is downward through inlet plenum 34 and counterflow upward through adsorption bed assemblies 24 and outlet plenum 36.

Referring now to FIG. 4, there is shown an individual adsorption bed frame section 50. Frame section 50 includes planar side panels 52 having substantially opposed parallelogram shaped sides 52. Frame sections 50 are configured so that the vertical edges of side panels 52 extend substantially vertically while the top and bottom edges are angled upward from front to rear, for receiving baffles and directing flow through adsorption bed assemblies 24, as explained hereinafter. Support members 58 extend parallel to a front portion 140 of frame section 50. Support members 58 support a honeycomb panel 56, as shown in FIG. 5. Honeycomb panel 56 is a planar member having a hexagonal orifices formed therein in a honeycomb-like grid. Such a honeycomb panel 56 maintains flow upward and aids in balanced distribution into adsorption bed assemblies 24, as explained hereinafter. The honeycomb panel support members 58 extend below flanges 64 and bed supports 54, which extend inward from each of side panels 52 and support an adsorption bed assembly 24.

At front face 140 of frame section 50 is an inlet register 60 having a plurality of orifices formed therein which are spaced evenly apart for directing air evenly across an adsorption bed inlet chamber 150 intermediate the top of a baffle 28 and a lower surface of an adsorption bed assembly 24. It can be appreciated that the adsorption bed inlet chamber 150 narrows from front to rear and aids in even distribution of the airflow from front to rear into the adsorption bed assembly. In a similar but opposite configuration, at a rear face 142 of each frame section 50, is an outlet register 62 having a plurality of orifices spaced evenly apart thereon. The space between the bottom of a baffle 28 and the upper portion of an adsorption bed assembly 24 forms an outlet chamber 152 that increases in height from front to rear. The configuration of inlet chamber 150 and outlet chamber 152 provides for counter flow from below and up through an adsorption bed assembly 24, as well as from front to rear from inlet 30 and inlet plenum 34, to outlet 32 and outlet plenum 36, as shown in FIG. 3.

Referring to FIGS. 4 and 5, each frame section includes flanges 64 which attach to baffle 28 and adjacent upper and lower frame sections 50. Seals and gaskets are used to ensure sealed airflow. It can be appreciated that with the sealed flow path and solid side panels 52, all air is directed through inlet and outlet registers 60 and 62 and through adsorption bed assembly 24.

Figure 9:
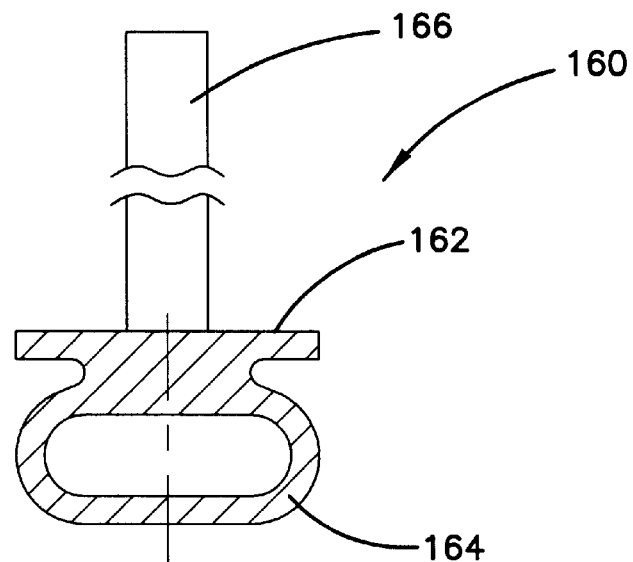
FIG. 9 shows a sectional view of the gasket for a frame module in a deflated state.
Figure 10:
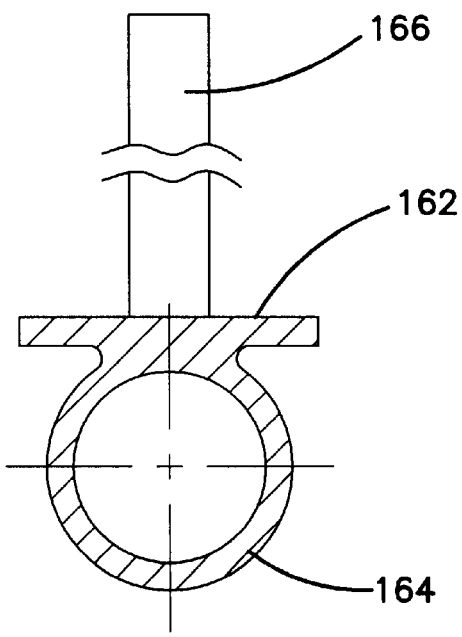
FIG. 10 shows a sectional view of the gasket for the frame module shown in FIG. 9 in an inflated state.

To ensure that air does not leak around adsorption bed assemblies 24, an inflatable gasket 160 is used with each frame section 50, as shown in FIGS. 9 and 10. Inflatable gasket 160 mounts below flange 70 along a flat upper face 162. Gasket 160 is rectangular generally corresponding to the outline to the shape of the rectangular flange 70. Gasket 160, having an oblong inflatable cross section 164 when uninflated, as shown in FIG. 9, extends downward when inflated, as shown in FIG. 10, to engage the top of an adsorption bed assembly 24, as explained hereinafter, to form an airtight seal. A stem 166 extends up to a fitting 66, as shown in FIG. 4. By sealing on the top of an adsorption bed assembly 24, a seal is made on the downstream or filtered clean air side. This configuration assures that no contaminants pass downstream on the clean air side.

Flange 70 includes a notch 72 for receiving stem 166 leading to fitting 66 mounted on one side panel 52. An air line 78 extends on the outside of side panel 52 from fitting 66 through an orifice 74 in front face 140 of flange 64. Air line 78 leads to a vertically extending portion of air line 78 with flow extending through tees and other fittings 76 providing pressurized air to inflatable gaskets 160.

Figure 6:
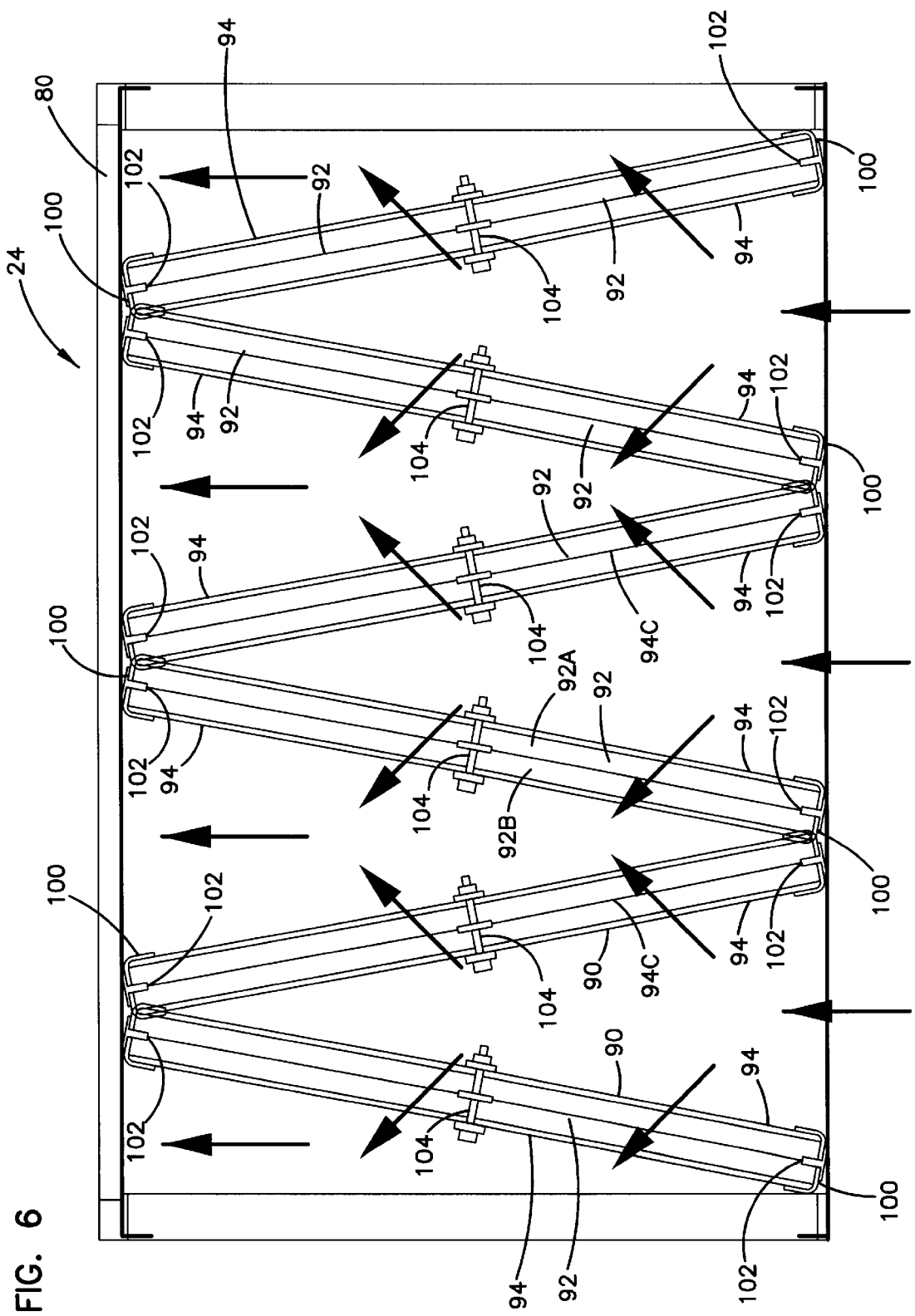
FIG. 6 shows a side sectional view of an adsorptive bed assembly.
Figure 7:
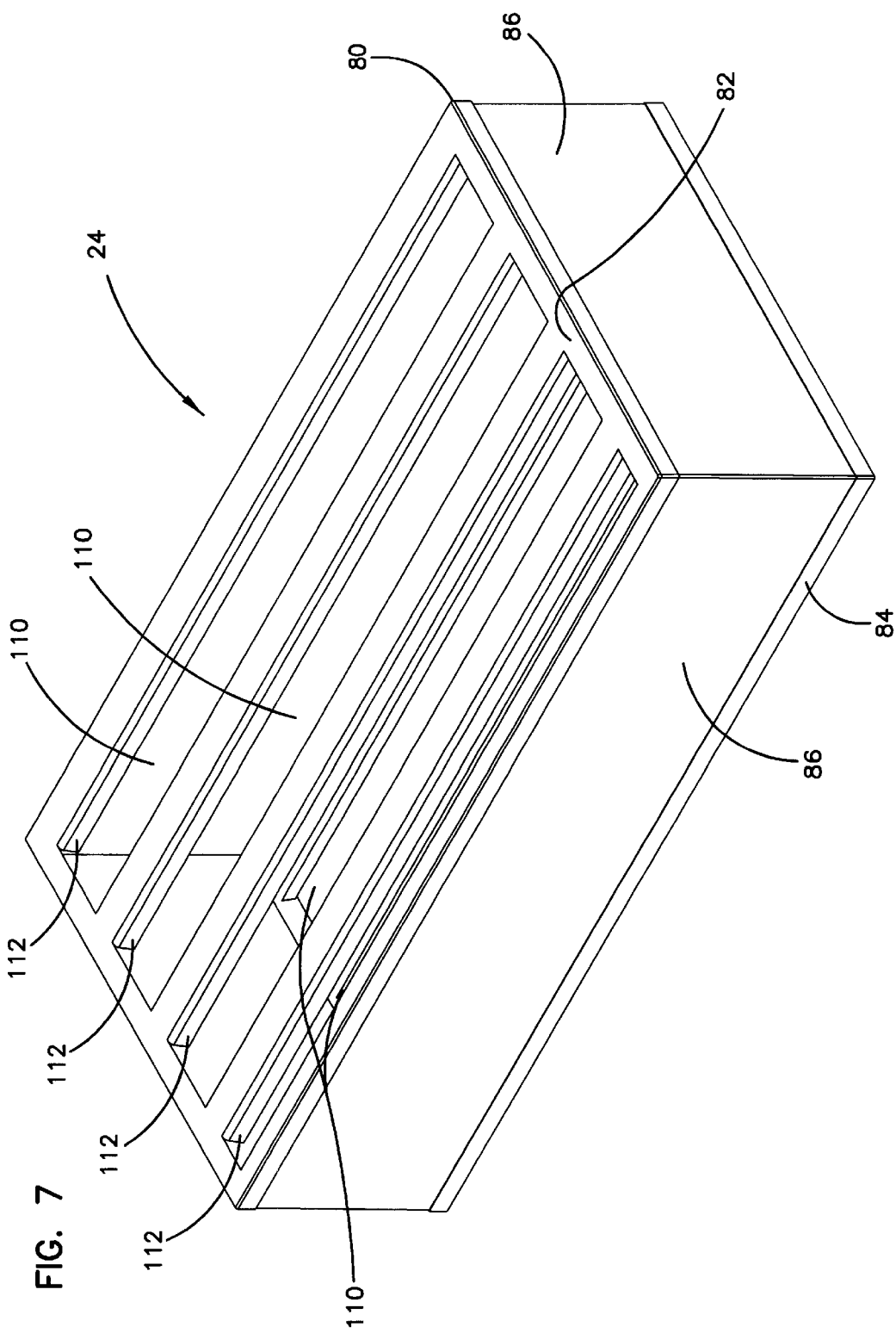
FIG. 7 shown a perspective view of the adsorptive bed cartridge shown in FIG. 6.

Referring now to FIGS. 6 and 7, there is shown an adsorptive bed assembly, generally designated 24. Adsorptive bed assembly 24 includes a generally rectangular housing 80, which includes a top panel 82 having generally rectangular openings 110 formed therein and bent in flange portions 112 extending into openings 110 providing a planar upper surface. Similarly, a bottom panel 84 includes a plurality of openings 110 having bent in flange portions 112. Openings 110 define inlets and outlets for adsorption bed assembly 24. Top and bottom panels 82 and 84 have a planar sealing surface, as explained hereinafter. Housing 80 also includes rectangular sides 86 which are sealed to top and bottom panels 82 and 84. Typical sizes of housings 80 are 12×6×24 inches or 18×8×30 inches. As shown in FIG. 6, within housing 80 are a plurality of adsorption layer segments 90 in a V-type angled configuration that aids in providing a smaller footprint. This configuration distributes flow evenly through the various segments 90 within housing 80, as shown by the flow arrows. The configuration of adsorption layer segments 90, in addition to the baffle arrangement and plenum ratios, provides for substantially even distribution to each segment 90 in the entire adsorptive filtering system 20 and therefore balanced deterioration of each segment 90.

Each adsorptive layer segment 90 includes a granular bed of adsorptive material 92 for removing airborne contaminants such as acids, bases, and other organic materials from the atmosphere. These contaminants often cause defects in sensitive semiconductor manufacturing processes. Adsorptive material 92 includes a first adsorptive media 92A and a second adsorptive media 92B, which remove various contaminants from the atmosphere. Preferably, first adsorptive media 92A removes contaminants different than what second adsorptive media 92B removes. In some embodiments, adsorptive material 92 may include a third adsorptive media. It is not necessary that the volume occupied by first adsorptive media 92A is the same as that occupied by second adsorptive media 92B; rather, it may be desired to vary the ratio between the two medias. For example, it may be desired to have 30% of adsorptive material 92 be first adsorptive media 92A and 70% be second adsorptive media 92B.

In general, adsorptive material 92, specifically first adsorptive media 92A and a second adsorptive media 92B, remove contaminants from the air by trapping the contaminants on the media surfaces. Typically, the surfaces of the adsorptive material 92 react with the contaminants, thus adsorbing the contaminants at least on the surfaces.

In some embodiments, the adsorptive material 92 itself may be the strongly reactive material. Examples of such materials include materials such as polymer particulates, activated carbon media, zeolites, clays, silica gels, and metal oxides. Preferred adsorptive material 92 includes granules such as zeolites, sodium bisulfate, and silica, although activated carbon is most typical. In other embodiments, the strongly reactive materials can be provided as surface coatings on carriers such as granular particulate, beads, fibers, fine powders, nanotubes, and aerogels. Alternately or additionally, the material that forms the reactive surfaces may be present throughout at least a portion of the carrier; this can be done, for example, by impregnating the carrier material with a desired material.

In accordance with the present invention, both first absorptive media 92A and second absorptive media 92B are present in each adsorptive layer segment 90. In one embodiment, first adsorptive media 92A filters out airborne basic compounds, organic bases such as ammonia, amines, amides, N-methyl 12-pyrrolidone, sodium hydroxides, lithium hydroxides, potassium hydroxides, volatile organic bases and nonvolatile organic bases. An example of a preferred material for removing basic contaminants, such as ammonia, is a bed of activated carbon granules impregnated with citric acid.

Second adsorptive media 92B, in the same embodiment, filters out airborne acidic compounds such as sulfur oxides, nitrogen oxides, hydrogen sulfide, hydrogen chloride, and volatile organic acids and nonvolatile organic acids. An example of a preferred material for removing acidic contaminants is a bed of impregnated activated carbon granules that are commercially available from C*Chem, a division of IONEX Research Corp. of Lafayette, Colo., under the trade designation "Chemsorb 1202". Another example of a preferred material for removing acid contaminants is a bed of activated carbon granules impregnated with potassium sulfate.

The media used for first adsorptive media 92A can be different than that used for second adsorptive media 92B, but typically, each will be activated carbon granules impregnated with or having a surface coating thereon of a modifying agent, as in the example embodiment above. Additionally, absorbent element 90 can include alternative media forms, such as ion exchange media, a catalytic media, or a molecular sieve. It is understood that in addition to removing, for example, acidic compounds or basic compounds, the adsorptive media 92A, 92B can adsorb or absorb additional contaminants, such as non-polar organics.

The granular adsorptive material 92 is maintained between mesh screens 94 which are substantially rectangular in shape. The adsorptive media 92A, 92B are tightly packed to force contact with airflow through the beds. It is preferable that the two medias 92A, 92B are spaced from each other so that, for example, they do not react with or neutralize one another. A dividing screen 94C can be provided to separate first adsorptive media 92A from second adsorptive media 92B. Around each of the screens 94 is a C-channel type frame 100. The frame 100 is potted to the sides 86 of the adsorption bed assembly housing 80 for an improved seal. Sealant 114 provides sealing to the top and bottom panels 82 and 84 respectively, as shown in FIG. 8.

In a preferred embodiment, the width of adsorptive material 92 in adsorption layer segment 90 should be at least ten times the mean particle diameter of the granules of adsorptive material 92. This generally ensures that satisfactory removal of contaminants is achieved and that particles cannot pass through the adsorption bed 24 without sufficient contact for removal.

In addition, each adsorption layer segment 90 has associated pre-filter panels 96 and post-filter panels 98. Panels 96, 98 are generally electrostatic type filters or other filters, are generally rectangular in shape, and are placed against the faces of the adsorption layer elements. Pre-filter 96 removes air borne particles prior to engaging adsorptive material 92 and retains any dust from the adsorptive material inside the filter during shipping, handling and filter replacement. Post-filter 98 ensures that any residual particles from adsorption layer segment 90 are filtered before passing to outlet 32.

Figure 8:
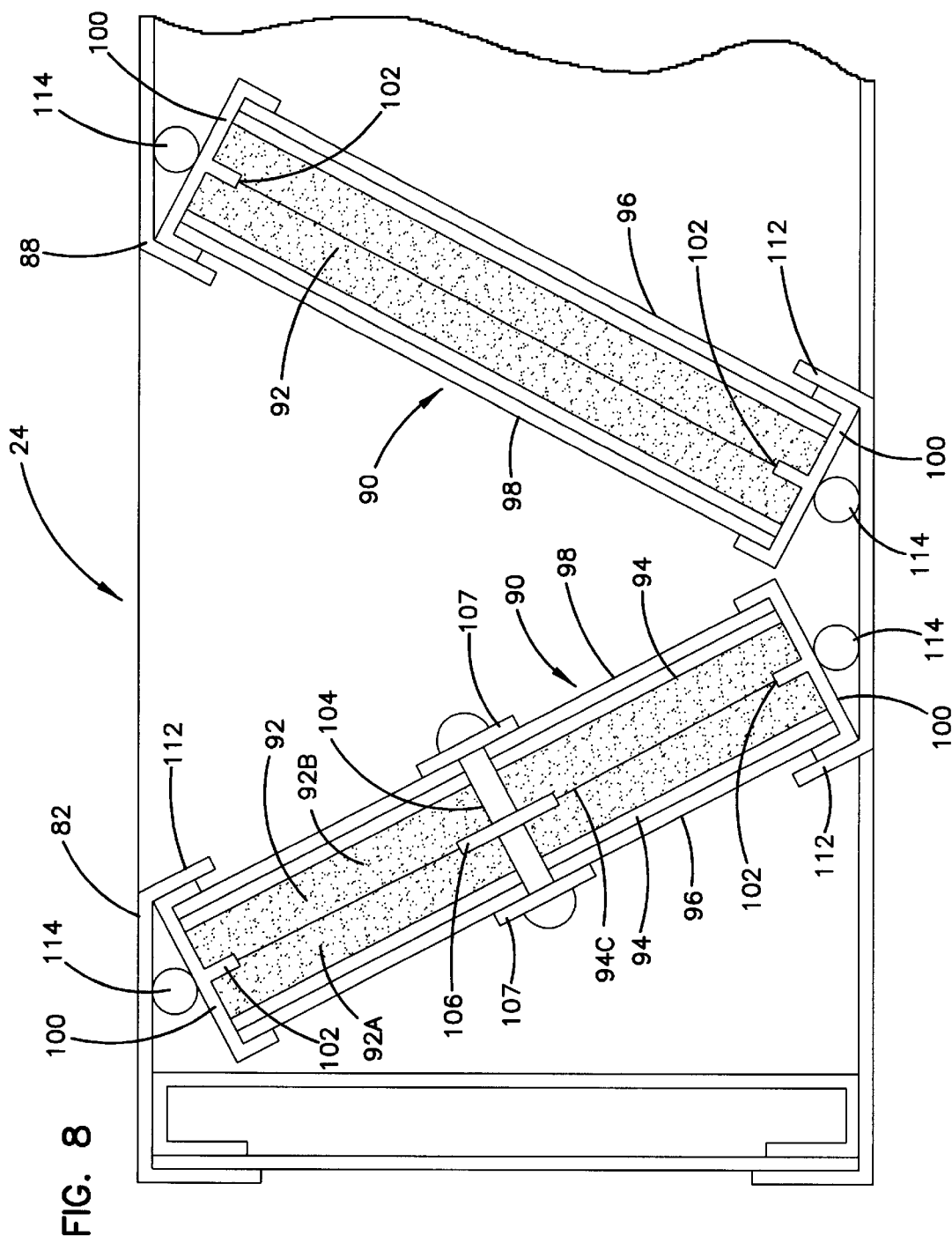
FIG. 8 shows a side sectional view of a self-contained adsorptive bed element.

Referring now to FIG. 8, there is shown a sectional view of an adsorption layer segment 90. Adsorption layer segment 90 includes a very tightly packed granular bed of adsorptive material 92. It can be appreciated that although flow through the center of adsorptive material 92 encounters little effect from the sides, near the edges of segment 90, and against the frame channel members 100, there are voids formed due to the planar surface proximate the round or unevenly shaped granules of adsorptive material 92. The curving surfaces of individual granules cannot fill all voids against the planar edges. It can be appreciated that filtering efficiency may be decreased as the contaminant gases may be able to proceed through adsorptive material 92 with less contact against the individual granules. It has been found that by increasing the length of the path along the edges of segment 90, the filtering efficiency at the edges of segment 90 increases. A mid-bed baffle 102 may be placed along the edge of segment 90 extending inward from the C-channel 100. The increased length of the journey of a contaminant ensures greater exposure to adsorptive material 92 and greater filtering efficiency.

In addition, a center post 104 may be added extending between mesh screens 94. It can be appreciated that under pressure, screens 94 may bow outward and resettling of the granules of adsorptive material 92 may occur leading to less efficiency. To maintain screens 94 at their normal substantially planar configuration, center post 104 is added which may include a retaining washer 107 engaging the outer periphery of each of mesh screens 94. As there may be some edge effects from center post 104, a mid-bed flange acting as a baffle 106, may be used with the center post. This configuration ensures a longer journey of particles along post 104 to overcome the possibility of effects from voids. It can also be appreciated however that as washers 107 tend to direct some of the flow away from the post, such a center post baffle 106 may not be necessary.

In addition to retaining the screens, a compression member may be utilized at one end of adsorption segment 90 to press inward against adsorptive material 92 and ensure that a tightly packed arrangement is maintained. It can also be appreciated that adsorption bed assemblies 24 may be refillable, as one of the end panels of sides 86 may be removable. Individual segments 90 may be replaced or the spent adsorptive material 92 may be emptied and active material replaced. It can also be appreciated that a compression member, well known in the art, may be added to a removable end cap in a refillable adsorption bed assembly.

Referring now to FIG. 1, there is shown an indicator system 120 for detecting airborne contaminants. It can be appreciated that with the present invention, it is advantageous to monitor the deterioration of adsorptive material 92. Therefore, a sampling system may be used which predicts the deterioration of the material 92. It can be appreciated that as adsorption segment 90 becomes spent, there is no visual or other indication that the filter elements are spent. Moreover, as the contaminant does not actually leave particles that cause a change in flow or pressure, pressure monitoring systems used with conventional particle filters cannot be used. By utilizing an indicator system, which has a deterioration rate proportional to that of the adsorption bed assembly, an indicator can predict the life of the adsorption bed assemblies and when a change should be made. System 120 uses a probe 122 upstream of the adsorption filters. The system includes a pump 124 such as an ejector type pump to maintain flow. An example of a suitable pump 124 is Model No. E-79700-00, available from Cole-Parner Company. Indicator system 120 has a sample flow that is proportional to the flow through the adsorption bed assemblies 24. To facilitate this, a flow meter 126 having a valve is utilized which may be used to calibrate this system to obtain the desired flow rate. It can be appreciated that by changing the flow through the system, faster or slower rates of deterioration of indicating system 120 can be accomplished. Therefore, safety margins may be changed to meet the requirements of each adsorption system 20.

Indicating system 120 also includes an indicator 128 including a tube 130 containing granules 132. Granules 132 are preferably coated with a color changing substance that changes in response to a pH change. Therefore, as airborne contaminants reach granules 132, the color of the spent granules will change. This change forms a front extending along tube 130 which can be viewed. It can be appreciated that by monitoring the progress of the front along tube 130, the deterioration stages of adsorption bed assemblies 24 may be monitored. In a preferred embodiment, sampling probe 122 is placed in inlet plenum 34 so that untreated air is sampled. It can be appreciated that the high standards of the adsorptive filtering requirements of the present invention negate the use of a downstream indicator which detects contaminants once they have passed through adsorptive filtering system 20. The delicate nature of the processes requires that adsorptive filters 24 cannot have a failure and must be changed prior to being completely spent, rather than immediately thereafter. Therefore, sampling of the air prior to treatment provides a satisfactory safety factor and an accurate predictor of the deterioration rate and life of adsorption layer elements 90. For easy monitoring, the indicator is placed on the exterior of door 38 of the counter flow adsorption module 22.

To facilitate effective treatment of the contaminated air, adsorptive system 20 receives fully operational adsorptive bed assemblies 24. By opening the access door 38, as shown in FIG. 1, self-contained cartridge-type adsorptive bed assemblies 24 may be slid into the corresponding frame sections 50 through the opening formed in the front face 140 of each frame section 50. Adsorption bed assemblies 24 rest on supports 54 and are below flange 70. It can be appreciated that inflatable sealing gasket 160 extends downward from flange 70 substantially around the periphery of rectangular adsorption bed assembly 24. In the uninflated state as shown in FIG. 9, gasket 160 does not engage upper panel 82 of adsorption bed assembly housing 80. However, once adsorption bed assemblies 24 have been inserted, compressed air is delivered to gaskets 160 and the inflatable tubing is expanded to the configuration shown in FIG. 10 and is forced downward to engage top panel 82 of assembly housing 80. As the top panel 82 has a substantially planar surface, the seal between gasket 160 and adsorption bed assembly housing 80 is uninterrupted, as no corners or other irregularities are encountered. Once gasket 160 is inflated, the downstream clean air side of the filtering system is sealed from the upstream side. Following insertion of adsorption bed assemblies 24, indication system 120 is calibrated to achieve the proper flow rate.

When air enters the system, it passes in the top of each module 22 through inlet 30 to inlet plenum 34. As explained above, the ratio of the cross sectional area of inlet plenum 34 to outlet plenum 36 provides balanced distribution between the various adsorption bed assemblies 24. Flow passes through each assembly 24 through the associated inlet register 60 on the front face 140 of the associated frame section 50. The flow encounters an upper face of one of baffles 28, which is angled upward and directs flow through honeycomb panel 156 into adsorption bed assembly 24. Inlet chamber 150 has a volume that provides substantially balanced distribution from front to rear along adsorption bed assemblies 24. Once the flow passes through honeycomb panel 56, the flow is directed in a substantially straight pattern upward. Adsorption layer elements 90 are angled at approximately ten degrees from vertical and receive even flow distribution, as indicated by the arrows in FIG. 6. The treated air continues to pass upward until engaging a lower face of baffle 28 above assembly 24 which directs the air from outlet chamber 152 through register outlet 62 at rear face 142 of each frame section 50. It can be appreciated that the baffle between vertically adjacent frame sections 50 and adsorption bed assemblies 24 acts both to direct flow upward into adsorption bed assembly 24 above baffle 28 and also directs air from adsorption bed assembly 24 below baffle 28 outward. This decreases the overall height of frame 26 and stack of adsorption bed assemblies 24. The filtered flow then passes to outlet plenum 36 and up through outlet 32.

When indicator system 20 signals changing of adsorption medium 92, the system is taken off line. Access door 38 is opened to provide access to all the cartridge-like adsorption bed assemblies 24. The compressed air supply to gaskets 160 is stopped and gaskets 160 deflate to the position shown in FIG. 9. At this time, gaskets 160 do not engage top panel 82 of adsorption bed assemblies 24. Adsorption bed assemblies 24 may then be slid forward through the opening formed in front face 140 of each frame section 50 and taken out through access door 38. New adsorption bed assemblies 24 may be inserted in their place and inflatable gasket 160 reinflated. In addition, indicator 128 may be replaced so that monitoring may continue which coincides with the newly received adsorption bed assemblies.

It can be appreciated that with the described invention, parallel flow is maintained with a system that has substantially self balancing flow to each adsorption bed assembly and to each adsorption bed segment 90 within each assembly 24. Such a flow pattern ensures that deterioration is constant among all elements 90. This avoids problems such as occur with non-balanced systems wherein one segment 90 becomes spent earlier than predicted or earlier than remaining elements. Such lack of balanced flow distribution can lead to changing of non-spent elements prior to the required time or failure of the system, which can be costly and damaging.

In addition, the system also provides for a filtration system with a much smaller footprint and with less size. Footprint savings of forty percent (40%) are possible as compared to prior systems, such as the Osendorf system of U.S. Pat. No. 5,290,345. Such a savings is made without loss of efficiency or filter media volume. In addition, flow and pressure drop are substantially the same for the reduced system volume.

Figure 12:
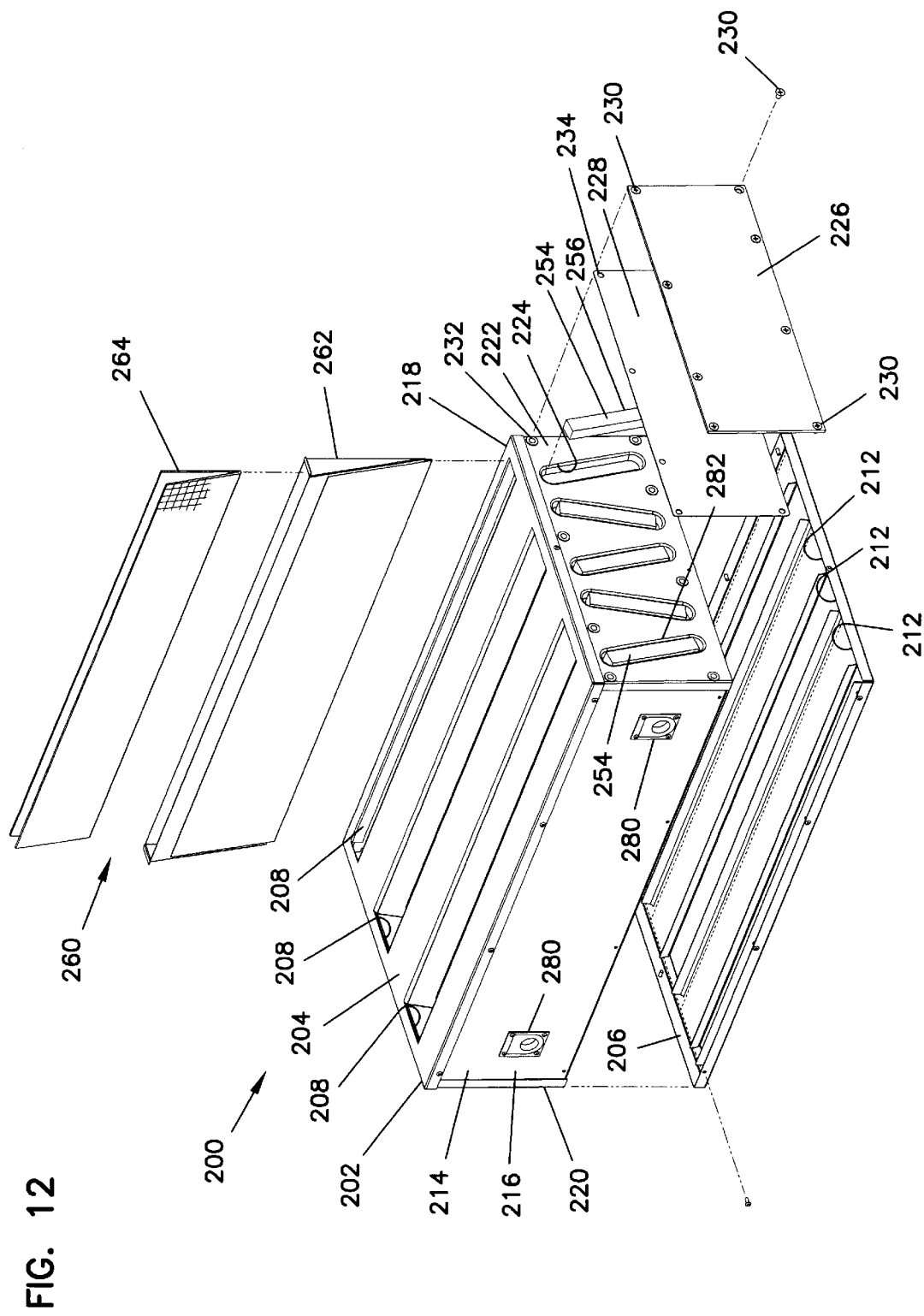
FIG. 12 is an exploded, perspective view of one embodiment of an adsorptive bed assembly, according to principles of the present invention.

In reference now to FIG. 12, an adsorption bed assembly is shown generally at 200, in exploded view. Adsorption bed assembly 200 is generally analogous to adsorption bed assembly 24, illustrated in FIG. 7, with the exception of certain refinements and improvements. However, adsorption bed assembly 200 operates in accordance with the principles described above, in an adsorption apparatus, such as that shown in FIG. 1 at 20.

Adsorption bed assembly 200 includes a housing 202 for supporting, holding, and containing a plurality of adsorption elements 240. In the specific embodiment illustrated, housing 202 comprises a rectangular, box-shaped configuration having a first or top panel 204, and a second or bottom panel 206. Top panel 204 defines a plurality of openings 208. In the embodiment illustrated, there are three elongated slots or openings 208, which when assembled in an adsorption apparatus, such as that illustrated in FIG. 1 at 20, function as outlet openings. Further, as described in more detail below, outlet openings 208 provide access to the housing interior, and in particular, to filter panels 260 (functioning as either pre-filters or post-filters) to allow filter panels 260 to be changed out.

Still referring to FIG. 12, bottom panel 206 defines a plurality of openings 212. Openings 212 are elongated slots, analogous to openings 208 in top panel 204. Inlet openings 212 allow for the flow of air to pass therethrough and into the interior of housing 202. Further, inlet openings 212 allow for the changeout and replacement of the pre- or post-filter panels 260, described in more detail below. In the embodiment illustrated, bottom panel 206 defines three inlet openings 212.

Preferably, top and bottom panels 204, 206 are constructed of sheet metal. Preferably, top and bottom panels 204, 206 are identical, for the ease of manufacturing and assembly.

Still in reference to FIG. 12, illustrated between top and bottom panels 204, 206 are a number of side panels 214. Specifically, housing 202 has a front side panel 216, and an opposite rear side panel 218. The front side panel 216 includes a pair of handles 280, to aid in removing and replacing bed assembly 200 in apparatus 20. Between front and rear panels 216, 218 are side panel 220 and access panel 222. Side panel 220 is a solid, closed member to provide support and closure at one end of housing 202.

Access panel 222 defines a plurality of openings or access slots 224 therein. Access slots 224 are elongated openings which are shaped and configured to hold and support an end of an adsorption element. In the embodiment illustrated, access panel 222 defines five slots 224. As can be seen FIG. 12, slots 224 are angled and configured in a V shape. That is, slots 224 are angled to conform to the profile of adsorption elements 240.

Housing 202 also includes a selectively removable access cover 226 that is removably mountable to access panel 222. That is, during operation of adsorption apparatus 20 using bed arrangement 200, access cover 226 is securely mounted on to access panel 222 to cover access panel 222, and in cooperation with a gasket member 228, provide a sealing engagement against adsorption elements 240.

Access cover 226 is removable such that the adsorption elements can be accessed, in order to change the filter element media. FIG. 12 illustrates access cover 226 in an unmounted, or removed position.

While a variety of operative embodiments are contemplated for allowing access cover 226 to be removably mounted to access panel 222, in the specific example illustrated, cover 226 is mountable and unmountable to access panel 222 by way of fasteners or screws 230. Access panel 222 includes a series of threaded holes 232 for receiving the screws 230. As can also be seen in FIG. 12, gasket member 228 includes a series of holes or apertures 234. When assembled in a configuration to be used in an adsorption apparatus such as that shown at 20 in FIG. 1, gasket member 228 is attached tightly to removable cover 226, which is attached securely to access panel 222 through the operation of screws 230 and holes 232.

Figure 13:
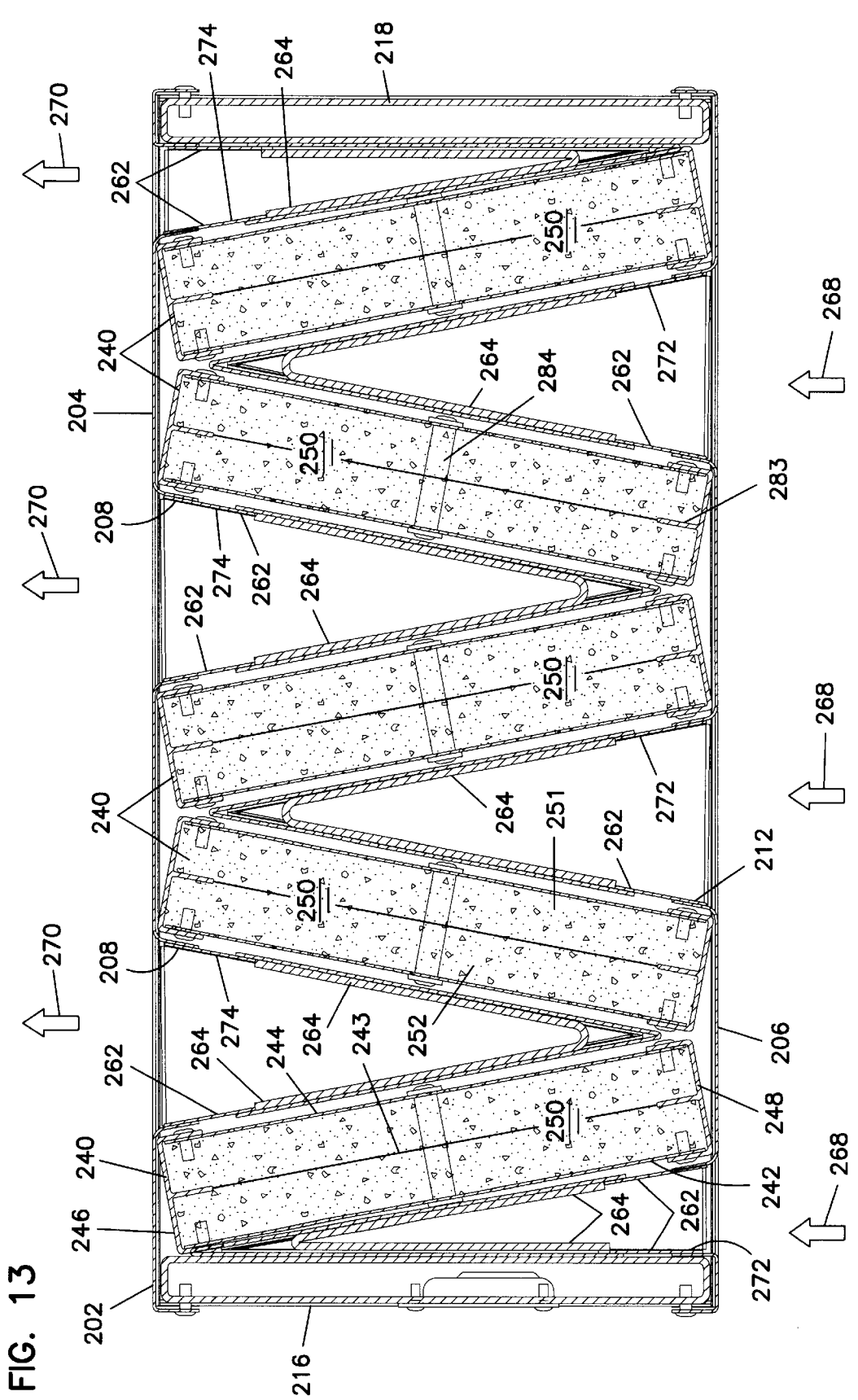
FIG. 13 is a cross-sectional, somewhat schematic, view of the embodiment of the adsorptive bed assembly illustrated in FIG. 12, according to principles of the present invention.

In reference now to FIG. 13, housing 202 holds and contains and supports a plurality of adsorption elements 240. In the embodiment illustrated in FIG. 13, five adsorption elements 240 are shown. Adsorption elements 240 are analogous to adsorption elements 90, described above. As such, elements 240 include a pair of oppositely disposed perforated members or screens 242, 244 and a dividing screen 243. Extruded frame members 246, 248 extend between the first and second screens 242, 244 and help to hold the adsorptive material 250 therein. Similar to first and second adsorptive media 92A and 92B, adsorption element 240 has first adsorptive media 251 and second adsorptive media 252. Each of elements 240 also includes a mid-bed baffle 283 and a center post 284, generally analogous as described above with respect to baffle 102 and center post 104 (FIG. 8). Center post 284 may include a flange acting as a baffle, analogous to flange 106 (FIG. 8).

Each of elements 240 has a pair of opposite ends. When positioned inside of housing 202, one of the ends is closed by side panel 220. The other end is positioned in one of slots 224 in access panel 222.

A cover member 254 is selectively positionable within slots 224 to cover the open end of elements 240. In the embodiment illustrated, each of slots 224 has a cover member 254 positioned therein to cover the open end of element 240 and block media 250 from falling out. Specifically, each of cover members 254 has a rectangular compression pad 256, preferably made of a soft urethane material. Each of compression pads 256 is squeezed into and fits snugly within slots 224. Compression pads keep the media 250 packed tightly between the screens 242, 244 and frame sections 246, 248. During shipping, media 250 may settle; compression pad 256 comprises a material, such as soft urethane, which expands to fill the space which becomes available when media 250 settles. Therefore, compression pads 256 function to maintain a tight, packed condition of the granules in media 250.

As mentioned above, a gasket member 228 is positioned between access cover 226 and access panel 222. Gasket member 228 is compressed between access cover 226 and access panel 222 to provide a tight seal along the ends of the adsorption elements 240. Preferably, gasket member 228 comprises a soft, compressible material, preferably foamed urethane.

In reference again to FIG. 12, adsorption bed assembly 200 includes a plurality of pre-filter panels and post-filter panels which are removably mounted within housing 202. In FIG. 12, filter panel assembly 260 is illustrated removed from housing 202, and in an exploded view.

In filter elements 90 described in reference to FIGS. 1 through 11, the pre-filter panels 96 and post-filter panels 98 are securely fastened and mounted to each adsorption segment 90. In this embodiment of adsorption elements 240, the pre-filter and post-filter panels are not rigidly secured and fastened to each of the adsorption elements 240. Rather, the pre-filter panels and post-filter panels are removably positionable and mountable between each of the adsorptive elements 240, to allow the pre-filter and post-filter panels to be changed out.

In the example illustrated in FIGS. 12 and 13, each of the pre-filter and post-filter panel assemblies 260 includes filter media 262 and support mesh 264. Media 262 has a triangular or V shaped cross section, generally in the profile shape of the adsorption elements 240 arranged in their V shaped pattern. Media 262 is preferably clay coated newsback with electrostatic media heat sealed thereon. Support mesh 264 also has a triangular or V-shaped cross section, and functions to support and hold the media 262 during airflow. Media 262 is insertable in openings 208, 212, to be positioned between adjacent adsorption elements 240. Double stick tape between media 262 and the top and bottom 204, 206 functions to removably mount and secure media 262 to housing 202. Support mesh 262 is formed into a V-shape which is slightly larger than the V-shape of media 262. When support mesh 264 is positioned inside of media 262, the edges of support mesh 264 snap under the edges of the clay coated newsback of media 262, and thereby secure mesh 264 to media 262.

In FIG. 13, the direction of airflow is shown flowing from an inlet side at arrows 268, through openings 212, through adsorption elements 240, out through openings 208, and out at arrows 270. Filter panel assemblies 260 on the upstream side 268 function as pre-filters 272, while filter panel assemblies 260 on the downstream side function as post-filters 274. Pre-filters 272 remove airborne particles prior to engaging the adsorption element 240 and granular media 250 and retain any dust from the adsorptive material inside of the filter during shipping. Post-filters 274 ensure that any residual particles from adsorptive element 240 are filtered before passing downstream.

Each of pre-filters 272 and post-filters 274 is removable and replaceable from adsorptive bed assembly 200. Specifically, each of pre-filters 272 may be removed through the slots or openings 212 in bottom panel 206. Each of post-filters 274 may be removed through the openings or slots 208 in top panel 204.

Adsorptive bed assembly 200 allows for convenient changing of the filtering media. After a period of use, it may be desirable to discard the old, spent media 250 and replace it with new, fresh media. In the example described above, indicating system 120 indicates to the operator when it is time to replace adsorptive media 250. To change the media in this embodiment, the adsorptive bed assembly is removed from adsorptive apparatus 20 through access door 38. Cover 226 is removed from adsorption bed housing 202 to expose compression pads 256. In order to remove access panel 226, screws 230 are unscrewed from access panel 222. Cover 226 is then removed from access panel 222, which breaks the seal provided by gasket member 228. Each of compression pads 256 is then removed from slots 224 covering the ends of each of adsorptive elements 240. This exposes media granules 250. Housing 202 is then tilted or angled relative to horizontal, and spent filter media 250 is poured from each of adsorptive elements 240. After each of elements 240 is drained of or emptied of the old, spent media 250, second or new or fresh granular, spherical, or rod-shaped media 250 is filled in each element 240. That is, media 250 is deposited between opposing screens 242, 244 and opposing frames 246, 248 by pouring it or depositing it through slots 224 in access panel 222. The second, new granular media is packed into place between screens 242, 244 and frames 246, 248, and then compression pads 256 are again positioned or placed within slots 224. Cover 226 having gasket member 228 secured thereto is again positioned to cover access panel 222 and compression pads 256. Cover 226 is refastened to housing 202 through screws 230. As cover 226 is tightened against access panel 222, gasket member 228 is compressed to form a seal between cover 226 and adsorption elements 240.

Each of filter panel assemblies 260 (i.e., either a pre-filter 272 or post-filter 274) may also be replaced. To replace filter panel assemblies 260, the operator grasps the pre- or post-filter media 262 through respective opening 208 or 212. Filter panel assembly 260 may be slid out through the appropriate opening (either 208 or 212) and discarded. A second, new filter panel assembly 260 (functioning as either a pre-filter 272 or post-filter 274) may be positioned between adsorptive elements 240 by inserting the second, new media 262 and support mesh 264 through associated opening 208 or 212. Double stick tape is applied to the outer surface of media 262 in order to adhere media 262 to the respective top or bottom panel 204, 206.

After granular adsorptive media 250 is changed and pre-filters 272 and post-filters 274 are replaced, as desired, adsorptive bed assembly 200 are again placed into adsorptive apparatus housing 20 through access door 38. Inflatable gasket 160 is again reinflated.

It will be understood that a wide variety of specific configurations and applications are feasible, using techniques described herein. In this section, a particular adsorptive bed assembly is described.

In housing 202, each of top panel 204, bottom panel 206, front side panel 216, rear side panel 218, side panel 220, access panel 222 and cover 226 is constructed of aluminum. Each of top panels 204 and bottom panels 206 has dimensions of about 10–15 by 22–27 inches, typically about 13.2 inches by 24.7 inches. Each of openings 208, 210 has a length of about 20–25 inches, typically about 23.2 inches, and a width of about 1–3 inches, typically about 2.3 inches. One of the openings is narrower than the other two, and has a width of about 0.5–2.5 inches, typically about 1.2 inches. Each of openings 210, 212 is spaced from an adjacent opening by about 1–4 inches, typically about 2.5 inches. Each of front side panels 216 has a length of about 22–27 inches, typically about 24.5 inches, and a height of about 4–7 inches, typically about 5.9 inches. Each of rear side panels 218 has a length of about 22–27 inches, typically about 24.5 inches, and a height of about 4–7 inches, typically about 5.9 inches. Side panel 220 has a length of about 10–15 inches, typically about 13.1 inches, and a height of about 4–7 inches, typically about 5.9 inches.

Access panel 222 has a length of about 10–15 inches, typically about 13.1 inches, and a height of about 4–7 inches, typically about 5.9 inches. Each of slots 224 has a width of about 0.4–1 inch, typically about 0.7 inches. Each of slots 224 has a flanged rib projecting from a planar surface of access panel 222. Flanged rib 282 projects a distance of about 0.25–0.75 inches, typically about 0.5 inches from the planar portion of access panel 222. Access cover 226 has a length of about 10–15 inches, typically about 13 inches, and a height of about 4–6 inches, typically about 5 inches. It is constructed of a pre-anodized aluminum 0.125 inches thick. It includes 6–12 holes, typically about 8 holes, for providing screws 230 to pass therethrough. Each of the holes has a 0.25 inch diameter with a 0.116 inch deep chamfer.

Gasket member 228 is constructed from low-perm polyurethane foam material having a thickness of about 0.07–0.25 inches, typically about 0.125 inches. It includes 8 holes having a diameter of 0.25 inches, for reception of screws 230.

Each of adsorptive elements 240 has an overall length of about 22–27 inches, typically about 24.4 inches, and a height of about 4–7 inches, typically about 5.9 inches. Each of screens 242, 244 is a perforated member with about 0.25–0.4 inch, typically about 0.33 inch, diameter holes in stainless steel. The screens are spaced a distance of about 0.75–1.5 inches, typically about 1.2 inches from each other. Elements 240 are arranged in a V-shape relative to each other. The angle between adjacent elements 240 is about 15–30 degrees, typically about 21 degrees.

Each of pre-filter assemblies 272 and post-filter assemblies 274 is constructed of 0.2–0.5 inch, typically about 0.30 inch, thick newsback clay coated on one side. Electrostatic media is heat sealed to the non clay-coated side. Support mesh 264 has a length of about 18–25 inches, typically about 22 inches, and each of the sides of the V has a length of about 3–5 inches, typically about 4 inches. The distance between the end tips of support mesh 264 is about 2.5–3.5 inches, typically about 3 inches. Support mesh 264 is constructed of 1 inch by 1 inch stainless steel welded 0.08 wire mesh.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. An adsorption bed arrangement comprising:
    (a) a plurality of V-shaped adsorption elements;
        (i) each of said adsorption elements including first and second, opposite screens, a center screen positioned between the first and second opposite screens, and at least one open end;
        (ii) each of said adsorption elements having first adsorptive media between said first screen and said center screen, and second adsorptive media between said center screen and said second screen; said first adsorptive media configured and adapted to remove a first contaminant from an incoming air stream, and said second adsorptive media configured and adapted to remove a second contaminant from the incoming air stream;
        (iii) each of said adsorption elements being selectively openable to provide access to said first and second adsorptive media;
    (b) a housing having first and second, opposite panels and a side panel, said housing defining an interior;
        (i) said first panel defining a plurality of inlet openings;
        (ii) said second panel defining a plurality of outlet openings; and
        (iii) said side panel being selectively removable to provide access to said adsorption elements positioned within said housing interior;
    (c) a gasket member between said housing and said adsorption elements; and
    (d) a selectively removable cover;
        (i) said cover being oriented over said adsorption element open ends;
        (ii) said removable cover being positioned between said gasket member and said adsorption elements; and
        (iii) said cover comprising a compression pad.

2. An adsorption bed arrangement according to claim 1 wherein:
    (a) at least one of said first adsorptive media and said second adsorptive media comprises carbon spheres, rods, or granules.

3. An adsorption bed arrangement according to claim 1 wherein:
    (a) said first adsorptive media is constructed and arranged to remove at least acidic contaminants from the incoming air stream; and
    (b) said second adsorptive media is constructed and arranged to remove at least basic contaminants from the incoming air stream.

4. An adsorption bed arrangement according to claim 3, wherein each of said first adsorptive media and said second adsorptive media comprises impregnated carbon granules.

5. An adsorption bed arrangement according to claim 4, wherein each of said first adsorptive media and said second adsorptive media is capable of removing non-polar organic contaminants from the incoming air stream.

6. An adsorption bed arrangement according to claim 1 further including:

(a) a plurality of pre-filter and post-filter panels; each of said pre-filter and post-filter panels being removably oriented between adjacent adsorption elements.

7. An adsorption bed arrangement according to claim 6 wherein:
   (a) each of said pre-filter and post-filter panels is sized relative to said inlet and outlet openings to be removably positionable through said inlet and outlet openings.

8. An adsorption bed arrangement according to claim 1 wherein:
   (a) each of said adsorption elements includes a baffle member between said first and second, opposite screens.

9. An adsorption apparatus comprising:
   (a) a housing including an inlet and an outlet, and defining an inlet plenum extending vertically;
   (b) a plurality of adsorption bed assemblies in a vertically stacked configuration and in fluid communication with the inlet plenum;
      (i) each of said adsorption bed assemblies including a plurality of adsorption elements;
         (A) each of said adsorption elements having a first adsorptive media therein and a second adsorptive media therein;
         (B) said first adsorptive media configured and adapted to remove a first contaminant from an incoming air stream, and said second adsorptive media configured and adapted to remove a second contaminant from the incoming air stream;
   (c) an access door proximate the inlet plenum for inserting and removing the plurality of adsorption bed assemblies through the inlet plenum; and
   (d) a sealing member between each of the plurality of adsorption bed assemblies and the housing.

10. An adsorption apparatus according to claim 9 wherein:
    (a) at least one of said first adsorptive media and said second adsorptive media is further configured and adapted to remove non-polar organic contaminants from the incoming air stream.

11. An adsorption apparatus according to claim 9 further comprising:
    (a) a baffle for directing air flow from below each of the adsorption bed assemblies and up through each of the adsorption bed assemblies.

12. An adsorption apparatus according to claim 9 wherein:
    (a) each of said adsorption bed assemblies includes a housing holding said adsorption elements;
       (i) each of said housings being selectively openable to provide access to said plurality of adsorption elements.

13. An adsorption apparatus according to claim 12 wherein:
    (a) each of said adsorption bed assemblies includes a gasket member providing a seal between each of said housings and said adsorption elements.

* * * * *

UNITED STATES PATENT AND TRADEMARK OFFICE
CERTIFICATE OF CORRECTION

PATENT NO. : 6,533,847 B2  Page 1 of 1
DATED : March 18, 2003
INVENTOR(S) : Seguin et al.

Figure 11:
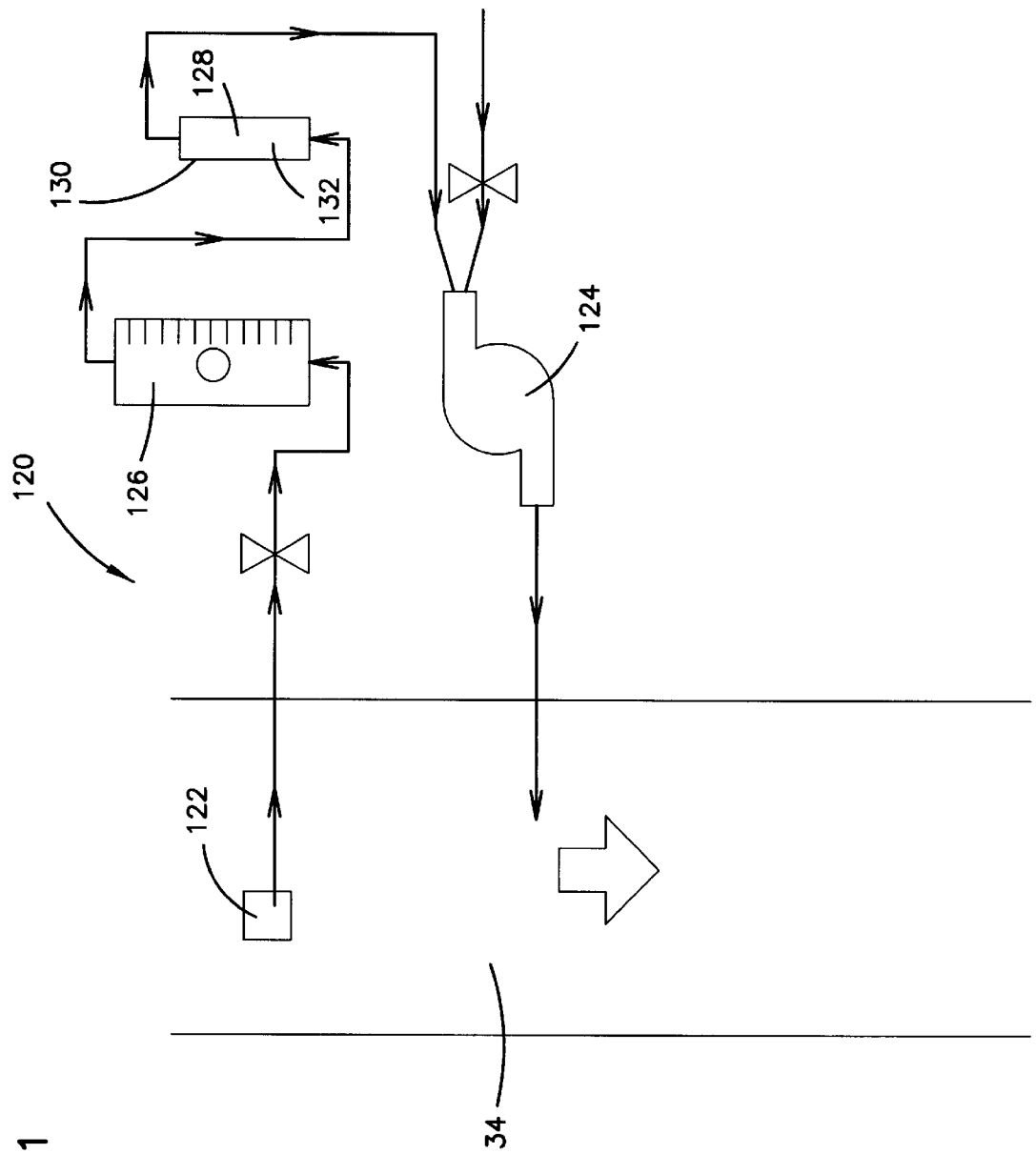
FIG. 11 shows a diagrammatic view of an indicator system for detecting airborne organic bases.

It is certified that error appears in the above-identified patent and that said Letters Patent is hereby corrected as shown below:

<u>Column 7,</u>
Line 26, "107" should read -- 106 --
Line 40, "FIG. 1," should read -- FIG. 11, --
Line 58, "Cole-Parner" should read -- Cole-Parmer --

Signed and Sealed this

Twenty-sixth Day of August, 2003

JAMES E. ROGAN
*Director of the United States Patent and Trademark Office*